United States Patent
Ho

(10) Patent No.: US 12,243,596 B2
(45) Date of Patent: Mar. 4, 2025

(54) FLASH MEMORY DEVICE AND PROGRAM METHOD THEREOF USING LEAKAGE CURRENT COMPENSATION

(71) Applicant: Winbond Electronics Corp., Taichung (TW)

(72) Inventor: Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 170 days.

(21) Appl. No.: 17/981,462

(22) Filed: Nov. 6, 2022

(65) Prior Publication Data
US 2024/0153569 A1 May 9, 2024

(51) Int. Cl.
| | |
|---|---|
| G11C 16/14 | (2006.01) |
| G11C 16/04 | (2006.01) |
| G11C 16/10 | (2006.01) |
| G11C 16/24 | (2006.01) |
| G11C 16/28 | (2006.01) |
| G11C 16/34 | (2006.01) |

(52) U.S. Cl.
CPC ........ G11C 16/3459 (2013.01); G11C 16/102 (2013.01); G11C 16/24 (2013.01); G11C 16/28 (2013.01)

(58) Field of Classification Search
CPC ... G11C 16/3459; G11C 16/102; G11C 16/24; G11C 16/28; G11C 29/00; G11C 16/10
See application file for complete search history.

(56) References Cited

U.S. PATENT DOCUMENTS

| | | | |
|---|---|---|---|
| 6,744,674 B1* | 6/2004 | Le | G11C 16/0475 365/185.21 |
| 7,630,253 B2 | 12/2009 | Melik-Martirosian et al. | |
| 8,305,817 B2 | 11/2012 | Park et al. | |
| 9,218,889 B1* | 12/2015 | Akhter | G11C 29/028 |
| 9,406,353 B2 | 8/2016 | Vimercati | |
| 2011/0069568 A1* | 3/2011 | Shin | G11C 11/4091 365/194 |
| 2017/0084314 A1* | 3/2017 | Fritsch | G11C 29/028 |

(Continued)

FOREIGN PATENT DOCUMENTS

| | | |
|---|---|---|
| CN | 103258570 | 5/2016 |
| TW | I336889 | 2/2011 |
| TW | I657442 | 4/2019 |

OTHER PUBLICATIONS

"Office Action of Taiwan Counterpart Application", issued on Jul. 26, 2023, p. 1-p. 5.

*Primary Examiner* — Hien N Nguyen
(74) *Attorney, Agent, or Firm* — JCIPRNET

(57) ABSTRACT

A flash memory device includes a memory array, a first global bit line, and a sense amplifying device. The memory array includes a first memory block having a plurality of first memory cells. In a leakage current detection operation, the sense amplifying device detects a leakage current generated by the first memory cells on the first global bit line to obtain leakage current simulation information. In a program operation, the sense amplifying device provides a reference current according to the leakage current simulation information, and compares a sensing current generated by a selected memory cell in the first memory cells on the first global bit line with the reference current to perform a program verification.

14 Claims, 6 Drawing Sheets

(56) References Cited

U.S. PATENT DOCUMENTS

| | | |
|---|---|---|
| 2019/0279732 A1 | 9/2019 | Huang |
| 2021/0012837 A1* | 1/2021 | Gangasani ........... G11C 13/003 |
| 2021/0248296 A1 | 8/2021 | Amoroso et al. |
| 2022/0208279 A1* | 6/2022 | Vijayvergia ........... G11C 16/24 |

* cited by examiner

FLASH MEMORY DEVICE AND PROGRAM METHOD THEREOF USING LEAKAGE CURRENT COMPENSATION

BACKGROUND OF THE INVENTION

Field of the Invention

The invention relates to a program method of a memory, and more particularly, to a flash memory device capable of compensating for leakage current and a program method thereof.

Description of Related Art

In a program-verify (PV) operation for a flash memory, a read voltage is applied to a selected memory cell, and the resulting cell current is detected. The cell current needs to be determined to be low enough in order to pass verification.

In addition to the cell current of selected memory cell, there is also leakage current generated by other memory cells on the global bit line. Therefore, what is actually compared with the reference current in PV is the sensing current formed by adding the cell current and the leakage current on the global bit line. When the sensing current is not low enough, a program pulse is applied to the word line coupled to the selected memory cell and PV is performed again, and the operation is repeated until the sensing current is determined to be low enough. Moreover, for a NOR flash memory, the leakage current is gradually increased with the increase of the number of loop operations (that is, the loop formed by the program operation and the erase operation) due to degradation. Therefore, there is a need to apply more program pulses to push the threshold voltage of the selected memory cell higher to keep the sensing current below the reference current during program verification. At the same time, the number of PVs is also increased. Under such a vicious cycle, page program time (tPP) is gradually increased as the number of loop operations is increased, resulting in loss of efficiency of the flash memory.

SUMMARY OF THE INVENTION

The invention provides a flash memory device and a program method thereof that may attempt to keep the page program time unchanged even after a number of loop operations.

A flash memory device of the invention includes a memory array, a first global bit line, and a sense amplifying device. The memory array includes a first memory block. The first memory block includes a plurality of first memory cells. The first global bit line is coupled to the first memory cells. The sense amplifying device is coupled to the first global bit line. In a leakage current detection operation, the sense amplifying device detects a leakage current generated by the first memory cells on the first global bit line to obtain leakage current simulation information. In a program operation, the sense amplifying device provides a reference current according to the leakage current simulation information, and compares a sensing current generated by a selected memory cell in the first memory cells on the first global bit line with the reference current to perform a program verification.

A program method of a flash memory device of the invention includes the following steps: detecting a leakage current generated by first memory cells on a first global bit line in a leakage current detection operation to obtain leakage current simulation information; and providing a reference current according to the leakage current simulation information in a program operation, and comparing a sensing current generated by a selected memory cell in the first memory cells on the first global bit line with the reference current to perform a program verification.

Based on the above, the flash memory device and the program method thereof of the invention may detect the leakage current generated by the memory blocks in advance before the program operation. Moreover, in the program operation, an appropriate reference current may be provided according to the magnitude of the leakage current to perform program verification. Accordingly, it is not necessary to apply more program pulses during program verification due to the influence of leakage current, and there is no adverse effect on page program time, thus avoiding the loss of efficiency of the flash memory.

DESCRIPTION OF THE EMBODIMENTS

Figure 1:
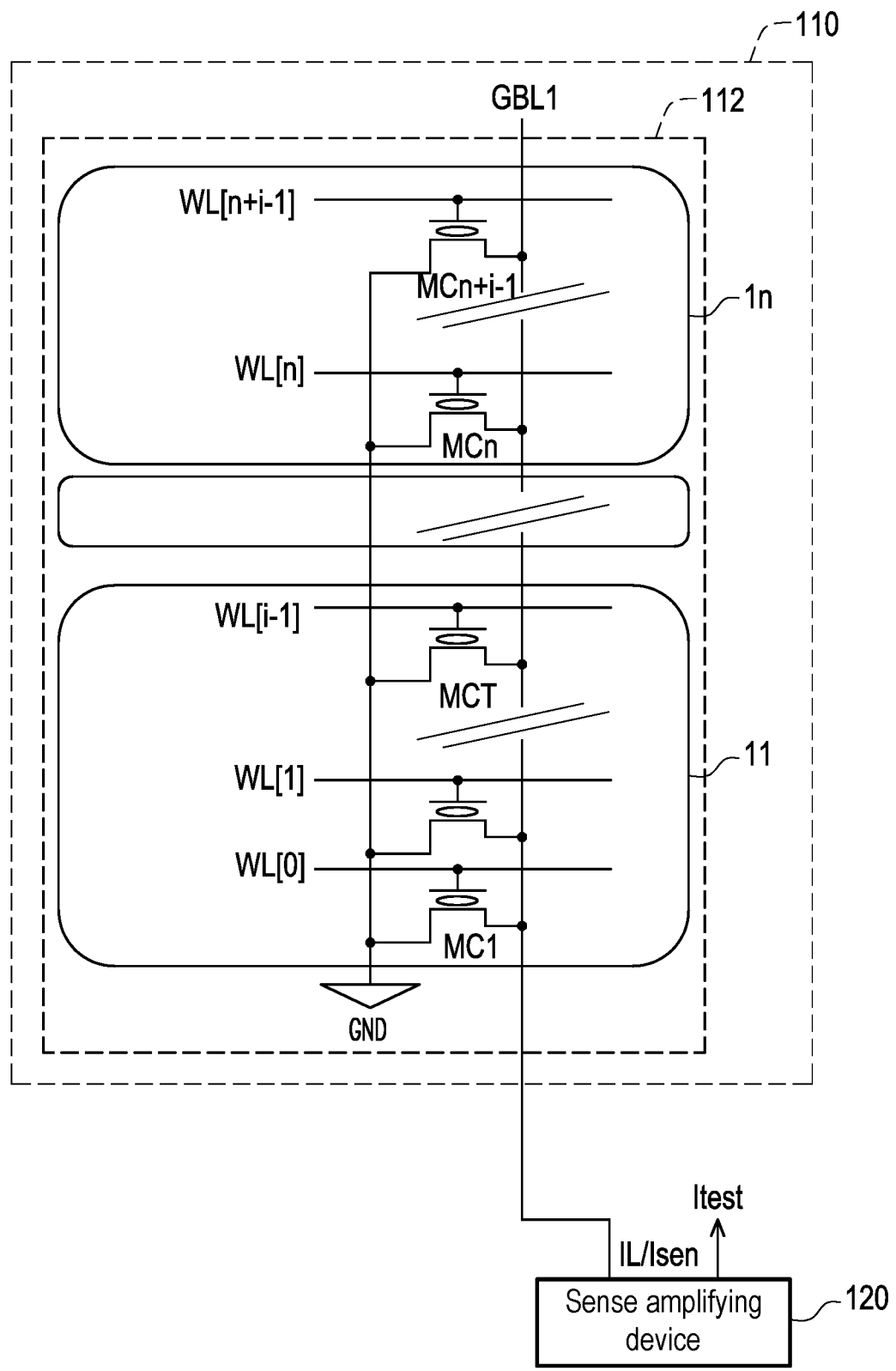
FIG. 1 shows a schematic diagram of a flash memory device of an embodiment of the invention.

Please refer to FIG. 1. FIG. 1 shows a schematic diagram of a flash memory device of an embodiment of the invention. A flash memory device 100 includes a memory array 110, a sense amplifying device 120, and a first global bit line GBL1. The memory array 110 includes a first memory block 112. The first memory block 112 includes a plurality of first memory cells MC1 to MCn+i−1. The first memory cells MC1 to MCn+i−1 are respectively coupled to word lines WL[0] to WL[n+i−1]. The source terminals of the first memory cells MC1 to MCn+i−1 are commonly coupled to a ground voltage GND. The first memory block 112 may be further divided into a plurality of sub-sections 11 to 1$n$, and the plurality of sub-sections 11 to 1$n$ share the first global bit line GBL1.

The first global bit line GBL1 is coupled to the first memory cells MC1 to MCn+i−1. The sense amplifying device 120 is coupled to the first global bit line GBL1. In a leakage current detection operation, the sense amplifying device 120 may detect a leakage current IL generated by the first memory cells MC1 to MCn+i−1 on the first global bit line GBL1 to obtain leakage current simulation information.

Specifically, in the leakage current detection operation, all of the word lines WL[0] to WL[n+i−1] corresponding to the first memory cells MC1 to MCn+i−1 are controlled to be in a disabled state. In this way, the memory cells in the first memory block 112 are all in a non-access state, and the sense amplifying device 120 may receive the leakage current IL generated on the first global bit line GBL1. At the same time, the sense amplifying device 120 may receive a test current Itest, and adjust the test current Itest according to a setting ratio to generate a replica leakage current ILR. The sense amplifying device 120 compares the replica leakage current ILR with the leakage current IL on the first global bit line GBL1 to generate a comparison result, and finds the replica leakage current ILR closest to the leakage current IL by adjusting the setting ratio to generate the leakage current simulation information.

In the program operation after the leakage current detection operation is completed, the sense amplifying device 120 provides a reference current Iref according to the leakage current simulation information, and compares a sensing current Isen generated by a selected memory cell MCT in the first memory cells MC1 to MCn+i−1 on the first global bit line GBL1 with the reference current Iref to perform a program verification.

Specifically, in the program operation, the word line WL[i−1] corresponding to the selected memory cell MCT is controlled to be in an enabled state, and word lines corresponding to the remaining first memory cells (memory cells other than the selected memory cell MCT in the first memory cells MC1 to MCn+i−1) are controlled to be in a disabled state. In this way, the selected memory cell MCT generates a cell current Icell on the first global bit line GBL1, and the sense amplifying device 120 may receive the sensing current Isen obtained by adding the cell current Icell and the leakage current IL on the first global bit line GBL1. At the same time, the sense amplifying device 120 also adjusts the test current Itest according to the leakage current simulation information obtained before to generate the reference current Iref. The sense amplifying device 120 compares the sensing current Isen with the reference current Iref to perform a program verification.

It should be mentioned that, since the reference current Iref is generated according to the leakage current simulation information, when the sense amplifying device 120 compares the sensing current Isen and the reference current Iref, the leakage current IL portion in the sensing current Isen may be eliminated. In this way, when performing the program verification, more program pulses do not need to be applied due to the leakage current in order to pass verification, and page program time is not adversely affected, so that the page program time may be maintained as much as possible after a number of loop operations.

Figure 2:
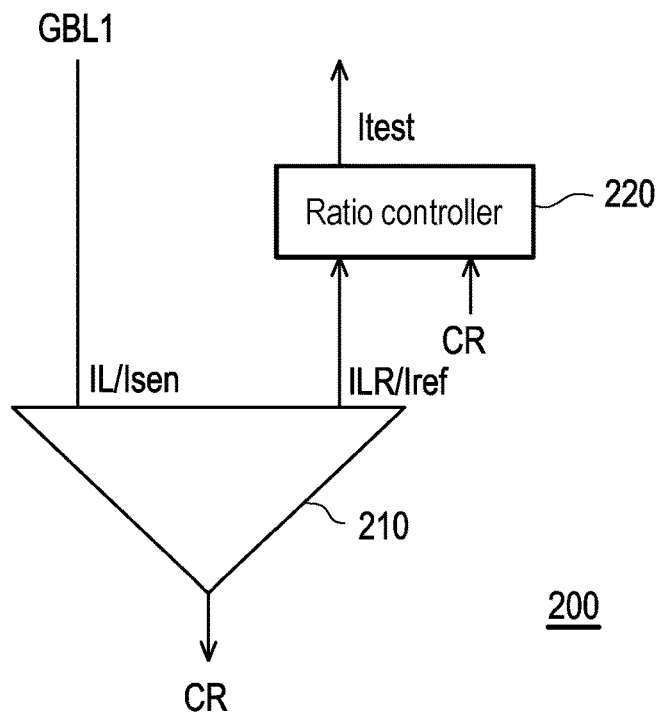
FIG. 2 shows a schematic diagram of a sense amplifying device of an embodiment of the invention.

FIG. 2 shows a schematic diagram of a sense amplifying device of an embodiment of the invention. Referring to FIG. 2, a sense amplifying device 200 includes a first sense amplifier 210 and a ratio controller 220. The first sense amplifier 210 has a first input terminal coupled to the first global bit line GBL1. The ratio controller 220 may be a processor having computing power. Or, the ratio controller 220 may be designed by a hardware description language (HDL) or any other design methods of a digital circuit known to those having ordinary skill in the art, and is a hardware circuit implemented by a field-programmable gate array (FPGA), a complex programmable logic device (CPLD), or an application-specific integrated circuit (ASIC). The ratio controller 220 is coupled to the second input terminal of the first sense amplifier 210. The ratio controller receives the test current Itest, and in the leakage current detection operation, adjusts the test current Itest according to the setting ratio to generate the replica leakage current ILR.

In the leakage current detection operation, the first sense amplifier 210 compares the leakage current IL on the first global bit line GBL1 with the replica leakage current ILR to generate a comparison result CR. The ratio controller 220 receives the comparison result CR, and when the comparison result CR maintains the first logic level, the ratio controller 220 adjusts the setting ratio. Moreover, the first sense amplifier 210 and the ratio controller 220 repeatedly perform the comparison between the leakage current IL on the first global bit line GBL1 and the replica leakage current ILR and the adjustment of the setting ratio until the comparison result CR is changed from the first logic level to the second logic level.

When the comparison result CR is changed from the first logic level to the second logic level, the replica leakage current ILR generated by the setting ratio at this time is closest to the leakage current IL. Therefore, the sense amplifying device 200 may store the corresponding setting ratio as the leakage current simulation information. Incidentally, in other embodiments, the sense amplifying device 200 may also directly store the current replica leakage current ILR as leakage current simulation information.

In the present embodiment, the test current Itest may be preset as one signal having a relatively high value. Under this condition, the ratio controller 220 may gradually reduce the setting ratio to perform the comparison action of the replica leakage current ILR and the leakage current IL. In the initial stage, the replica leakage current ILR may be greater than the leakage current IL, and the comparison result CR is set to the first logic level. As the setting ratio is reduced, the replica leakage current ILR may be adjusted to be less than or equal to the leakage current IL, and the first sense amplifier 210 may generate the comparison result CR at the second logic level. The replica leakage current ILR at this time is in a state closest to the leakage current IL. Or, the test current Itest may also be preset as one signal having a relatively low value. Under this condition, the ratio controller 220 may gradually increase the setting ratio to perform the comparison action of the replica leakage current ILR and the leakage current IL. In the initial stage, the replica leakage current ILR may be less than the leakage current IL, and the comparison result CR is set to the first logic level. As the setting ratio is increased, the replica leakage current ILR may be adjusted to be greater than or equal to the leakage current IL, and the first sense amplifier 210 may generate the comparison result CR at the second logic level. The replica leakage current ILR at this time may also be in a state closest to the leakage current IL. In addition, the first logic level may be logic 1 or logic 0, and the second logic level may be logic 0 or 1 complementary to the first logic level.

Figure 3:
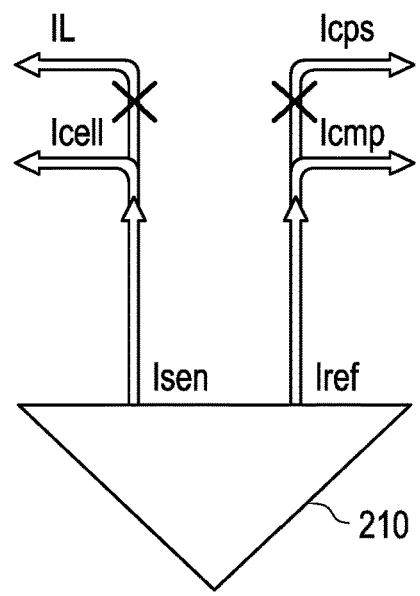
FIG. 3 shows a schematic diagram of a reference current and a sensing current of a program operation of an embodiment of the invention.

FIG. 3 shows a schematic diagram of a reference current and a sensing current of a program operation of an embodiment of the invention. Referring to FIG. 3, the reference current Iref used in the program operation after the leakage current detection operation is completed is formed by the addition of a comparison current Icmp and a compensation current Icps, and the sensing current Isen is formed by the addition of the cell current Icell and the leakage current IL. The sense amplifying device 200 may provide the compensation current Icps according to the leakage current simulation information obtained before, so that the compensation current Icps is equivalent to the replica leakage current ILR corresponding to the stored setting ratio. The comparison current Icmp is, for example, a current used to verify whether the program is successful during program verification in general. Therefore, when the first sense amplifier 210 compares the sensing current Isen with the reference current Iref, the portion of the leakage current IL in the sensing current Isen and the portion of the compensation current Icps in the reference current Iref may cancel each other. In this way, when performing the program verification, more program pulses do not need to be applied due to the leakage current in order to pass verification, and page program time is not adversely affected, so that the page program time may be maintained as much as possible after a number of loop operations, thus avoiding loss of efficiency of the flash memory.

It should be noted that loss of efficiency of the flash memory may be reflected in three aspects, such as program failure, intrinsic deterioration of memory cells, and non-compliance with technical specifications. Usually, inside the flash memory device, the repetition times of applying program pulses and performing program verification are limited to avoid excessive page program time. Therefore, when the leakage current is too high and the program verification keeps failing, the program fails. The leakage current causes more program pulses to be applied to program the selected memory cell to a higher threshold voltage state to compensate. However, this means that more electrons are injected into the oxide layer region, increasing the likelihood of oxide layer degradation and leading to reliability issues regarding the intrinsic degradation of the memory cell. Also, if the page program time is too long, the time length specified by the technical specification is not met. The flash memory device of the invention may attempt to keep the page program time unchanged after a number of loop operations, thereby avoiding the occurrence of the above issues.

Figure 4:
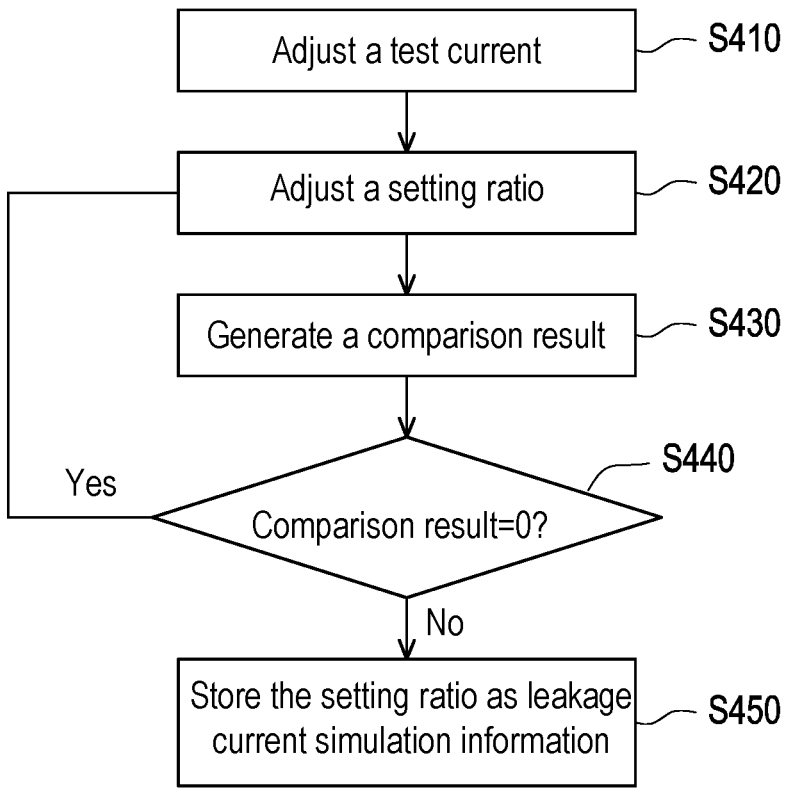
FIG. 4 shows a flowchart of a leakage current detection operation of an embodiment of the invention.

Please refer to FIG. 4 below. FIG. 4 shows a flowchart of a leakage current detection operation of an embodiment of the invention. In step S410, the value of the test current Itest may be set via a trim mechanism of the test process during wafer testing. The test current Itest may be set to a current value having a relatively large value. The trim mechanism of the test process may be performed by blowing (or not blowing) an electronic fuse, or by using an adjustment technique of the test process known to those having ordinary skill in the art, and there is no particular limitation.

In step S420, an adjustment operation of the setting ratio is performed. In the present embodiment, the initial setting ratio may be equal to 100%. Via the test current Itest and the setting ratio, the sense amplifying device of the present embodiment may generate the replica leakage current ILR and compare the replica leakage current ILR with the leakage current IR on the global bit line, and generate the comparison result CR in step S430.

In step S440, whether the comparison result CR is equal to the initial value (e.g., logic 0) is determined. If the determination result is yes, step S420 is re-executed to further reduce the setting ratio. If the determination result is no, the setting ratio may be stored as leakage current simulation information (step S450).

Incidentally, step S410 in the present embodiment may also adjust one relatively small test current Itest via the trim mechanism of the test process. In this case, the initial setting ratio in step S420 is a ratio less than 100%. And after the determination result of step S440 is yes, step S420 may further increase the setting ratio.

Figure 5A:
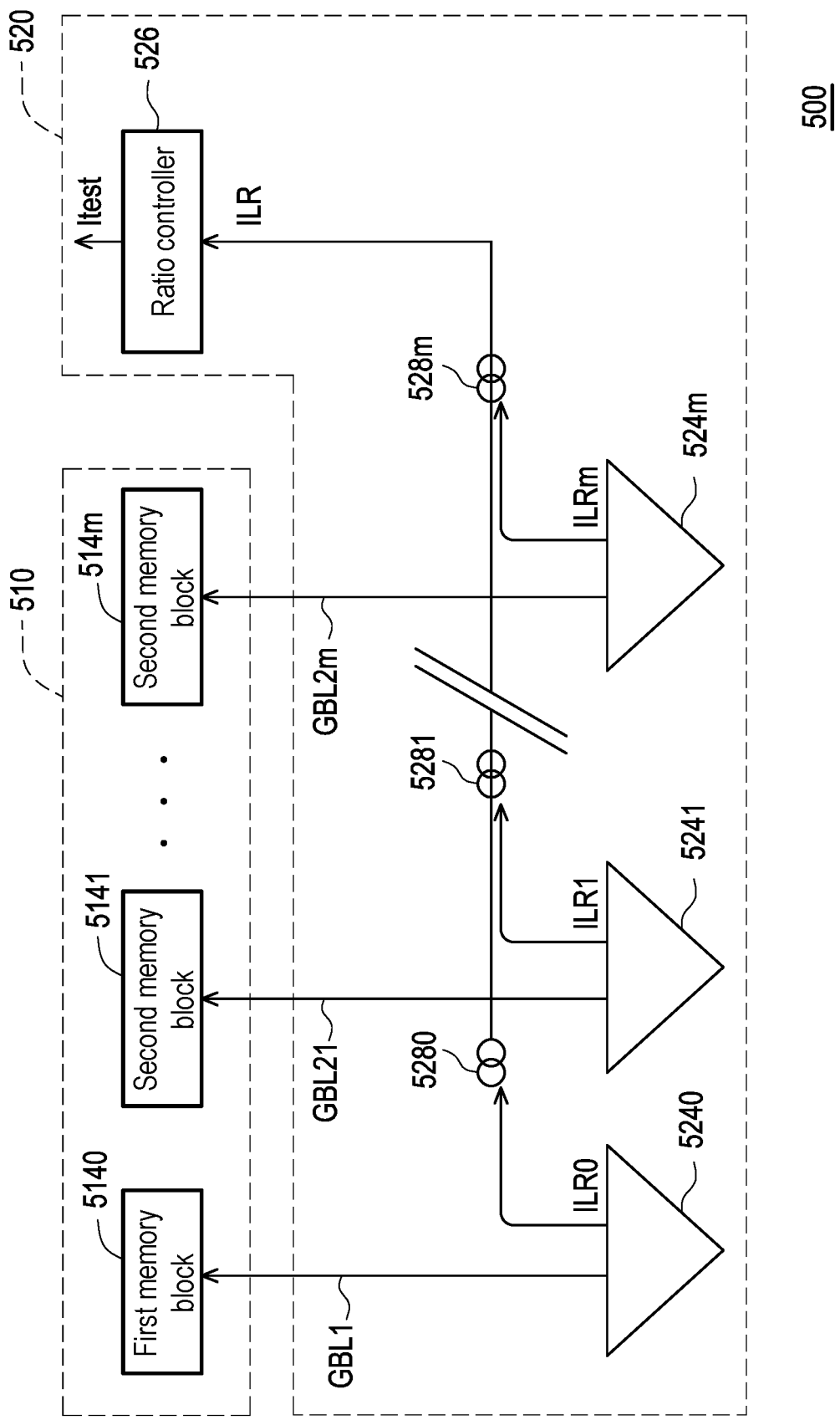
FIG. 5A and FIG. 5B show schematic diagrams of a flash memory device of an embodiment of the invention.
Figure 5B:
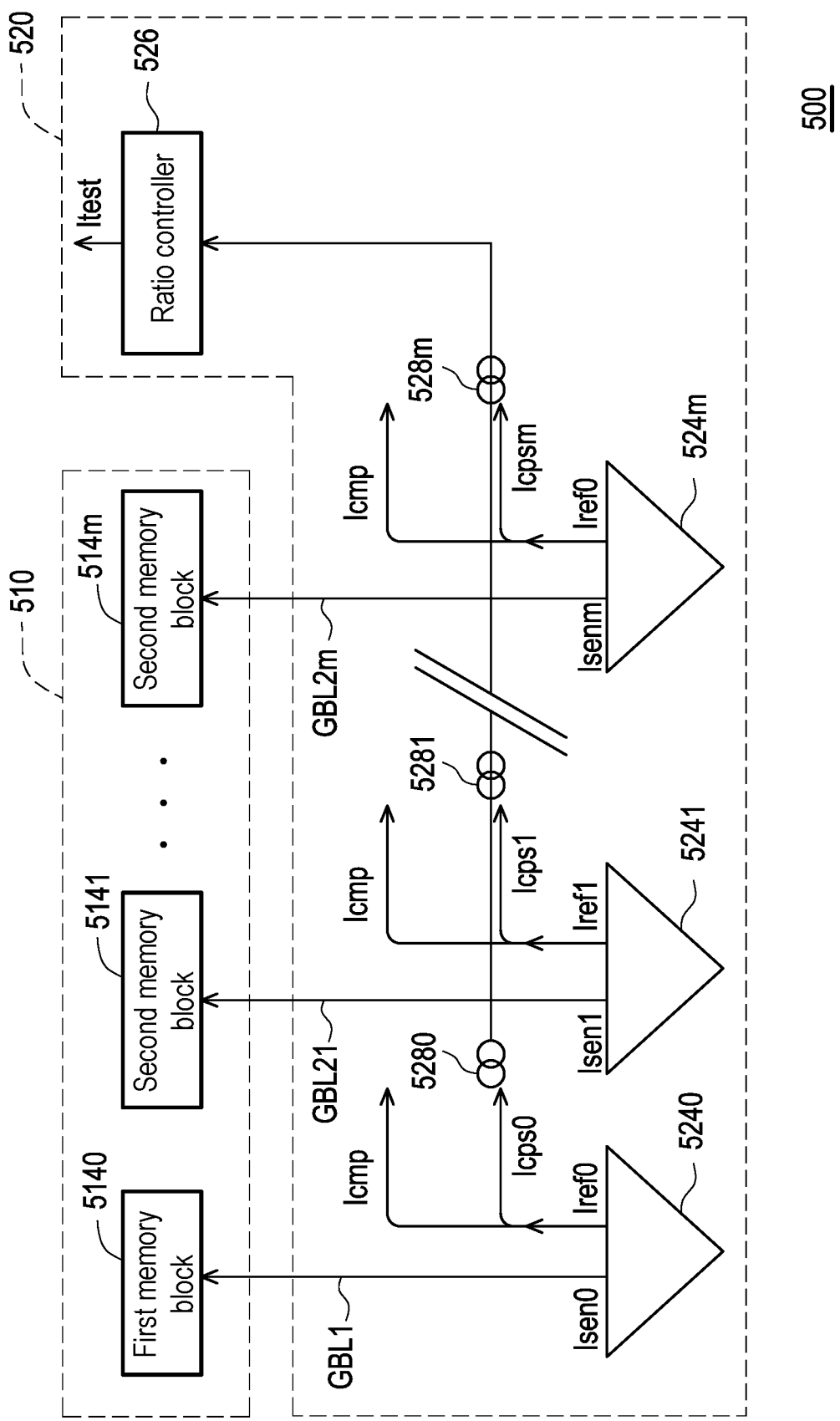

FIG. 5A and FIG. 5B show schematic diagrams of a flash memory device of an embodiment of the invention. In FIG. 5A and FIG. 5B, a flash memory device 500 includes a memory array 510, a sense amplifying device 520, the first global bit line GBL1, and second global bit lines GBL21 to GBL2m. The memory array 510 includes a first memory block 5140 and second memory blocks 5141 to 514m. The first memory block 5140 is coupled to the first global bit line GBL1. The second memory blocks 5141 to 514m are respectively coupled to the second global bit lines GBL21 to GBL2m. The first memory block 5140 and the second memory blocks 5141 to 514m respectively include a plurality of memory cells therein. The plurality of memory cells included in the first memory block 5140 and the second memory blocks 5141 to 514m are respectively coupled to corresponding global bit lines.

The sense amplifying device 520 includes a first sense amplifier 5240, second sense amplifiers 5241 to 524m, a ratio controller 526, and current mirrors 5280 to 528m. The first input terminal of the first sense amplifier 5240 is coupled to the first global bit line GBL1. The first input terminal of each of the second sense amplifiers 5241 to 524m is coupled to the corresponding second global bit line in the second global bit lines GBL21 to GBL2m. The current mirrors 5280 to 528m are respectively coupled to the second input terminal of the first sense amplifier 5240 and the second input terminals of the second sense amplifiers 5241 to 524m.

As shown in FIG. 5A, in the leakage current detection operation, the leakage current ILR is generated by multiplying the setting ratio by the test signal Itest via the ratio controller 526. The replica leakage current ILR may generate mirrored replica leakage currents ILR0 to ILRm, respectively via the mirroring action of the current mirrors 5280 to 528m, to be transmitted to the first sense amplifier 5240 and the second sense amplifiers 5241 to 524m. In this way, via the comparison result of the first sense amplifier 5240 and the second sense amplifiers 5241 to 524m, and in cooperation with the ratio controller 526 to gradually adjust the setting ratio, the current simulation information of the plurality of memory cell blocks corresponding to the first global bit line GBL1 and the second global bit lines GBL21 to GBL2m may be calculated one by one, so as to quickly complete the leakage current detection operation. At this time, the current mirrors 5280 to 528m may have the same mirror ratio, and the current simulation information corresponding to each of the memory cell blocks may be obtained simply by adjusting the setting ratio.

As shown in FIG. 5B, in the program operation after the leakage current detection operation is completed, the current mirrors 5280 to 528m may have different mirror ratios, respectively, the plurality of mirror ratios are respectively equivalent to a plurality of weight values, and correspond to the current simulation information of the first memory block 5140 and the second memory blocks 5141 to 514m respectively. At this time, the ratio controller 526 may fix the setting ratio at 100%, and transmit a current equal to the test current Itest to each of the current mirrors 5280 to 528m. In this way, each of the current mirrors 5280 to 528m may mirror the test current Itest according to the corresponding leakage current simulation information to generate compensation currents Icps0 to Icpsm, respectively. The leakage current portion in sensing currents Isen0 to Isem may cancel out the compensation current Icps0 to Icpsm portions in reference currents Iref0 to Irefm, respectively.

Figure 6:
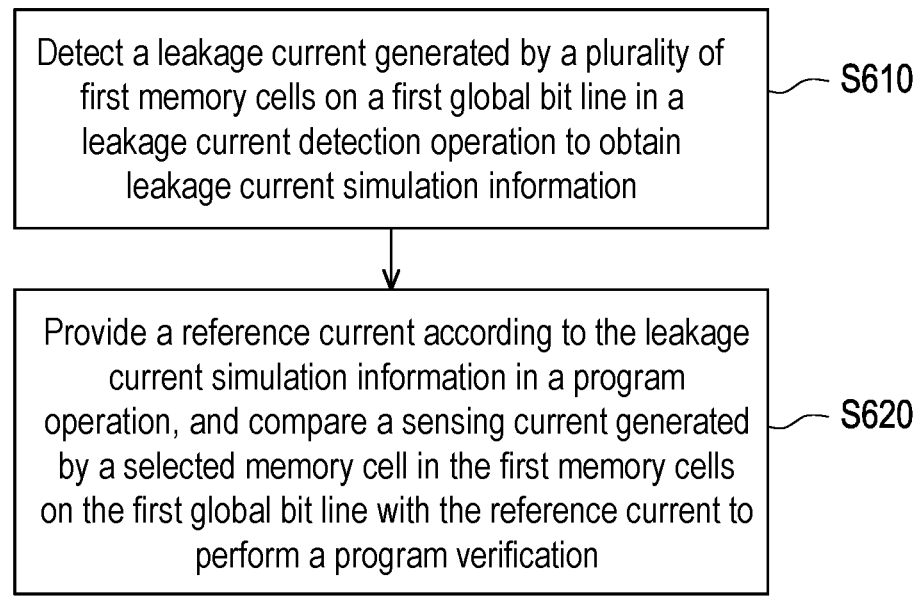
FIG. 6 shows a flowchart of a program method of a flash memory device of an embodiment of the invention.

FIG. 6 shows a flowchart of a program method of a flash memory device of an embodiment of the invention. Please refer to FIG. 1 and FIG. 6 at the same time, the method of the present embodiment may be applied to the flash memory device 100 of FIG. 1. In step S610, in a leakage current detection operation, the leakage current IL generated by the first memory cells MC1 to MCn+i−1 on the first global bit line GBL1 is detected to obtain leakage current simulation information. In step S620, the sense amplifying device 120 provides the reference current Iref according to the leakage current simulation information, and compares the sensing current Isen generated by the selected memory cell MCT in the first memory cells MC1 to MCn+i−1 on the first global bit line GBL1 with the reference current Iref to perform a program verification. The implementation details of the above steps are described in detail in the above embodiments, and are not repeated herein.

Based on the above, the flash memory device and the program method thereof of the invention may detect the leakage current generated by the memory blocks in advance as the leakage current simulation information before the program operation. Also, the leakage current simulation information may provide an appropriate reference current to be compared with the sensing current in the program operation to offset the leakage current portion of the sensing current. Accordingly, more program pulses do not need to be applied during program verification due to the influence of leakage current, and there is no adverse effect on page program time, thus avoiding the loss of efficiency of the flash memory.

What is claimed is:

1. A flash memory device, comprising:
a memory array comprising a first memory block, wherein the first memory block comprises a plurality of first memory cells;
a first global bit line coupled to the first memory cells; and
a sense amplifying device coupled to the first global bit line, wherein in a leakage current detection operation, the sense amplifying device detects a leakage current generated by the first memory cells on the first global bit line to obtain leakage current simulation information,
wherein in a program operation, the sense amplifying device provides a reference current according to the leakage current simulation information and compares a sensing current generated by a selected memory cell in the first memory cells on the first global bit line with the reference current to perform a program verification,
wherein the sense amplifying device comprises:
a first sense amplifier having a first input terminal coupled to the first global bit line; and
a ratio controller coupled to a second input terminal of the first sense amplifier, wherein the ratio controller receives a test current, and in the leakage current detection operation, adjusts the test current according to a setting ratio to generate a replica leakage current.

2. The flash memory device of claim 1, wherein in the leakage current detection operation, the first sense amplifier compares a leakage current on the first global bit line with the replica leakage current to generate a comparison result, and when the comparison result maintains a first logic level, the ratio controller adjusts the setting ratio, and the first sense amplifier and the ratio controller again compare the leakage current on the first global bit line and the replica leakage current and adjust the setting ratio, until the comparison result is changed from the first logic level to a second logic level.

3. The flash memory device of claim 2, wherein when the comparison result is changed from the first logic level to the second logic level, the sense amplifying device stores the corresponding setting ratio as the leakage current simulation information.

4. The flash memory device of claim 1, wherein the reference current is formed by adding a comparison current and a compensation current, and in the program operation, the sense amplifying device provides the compensation current according to the leakage current simulation information, and the compensation current is comparable to the replica leakage current corresponding to the stored setting ratio.

5. The flash memory device of claim 1, wherein in the leakage current detection operation, all word lines corresponding to the first memory cells are in a disabled state.

6. The flash memory device of claim 1, wherein in the program operation, a word line corresponding to the selected memory cell is in an enabled state, and word lines corresponding to the remaining first memory cells are in a disabled state.

7. The flash memory device of claim 1, further comprising a plurality of second global bit lines, wherein
the memory array further comprises a plurality of second memory blocks, wherein each of the second memory blocks comprises a plurality of second memory cells, and each of the second memory cells is coupled to the corresponding second global bit line,
the sense amplifying device further comprises a plurality of second sense amplifiers and a plurality of current mirrors, and a first input terminal of each of the second sense amplifiers is coupled to the corresponding second global bit line,
the current mirrors are respectively coupled to a second input terminal of the first sense amplifier and second input terminals of the second sense amplifiers, and in the program operation, each of the current mirrors a test current according to corresponding leakage current simulation information to generate a respective compensation current.

8. A program method of a flash memory device, wherein the flash memory device comprises a memory array and a sense amplifying device coupled to a first global bit line, the memory array comprises a first memory block having a plurality of first memory cells, and each of the memory cells is coupled to the first global bit line,
wherein the program method comprises the following steps:
detecting a leakage current generated by the first memory cells on the first global bit line in a leakage current detection operation to obtain leakage current simulation information; and
providing a reference current according to the leakage current simulation information in a program operation, and comparing a sensing current generated by a selected memory cell in the first memory cells on the first global bit line with the reference current to perform a program verification,
wherein the sense amplifying device comprises:
a first sense amplifier having a first input terminal coupled to the first global bit line; and
a ratio controller coupled to a second input terminal of the first sense amplifier,
wherein in the leakage current detection operation, the step of detecting the leakage current generated by the first memory cells on the first global bit line to obtain the leakage current simulation information comprises:
receiving a test current through the ratio controller, and adjusting the test current according to a setting ratio in the leakage current detection operation to generate a replica leakage current through the ratio controller.

9. The program method of the flash memory device of claim 8, wherein in the leakage current detection operation, the step of detecting the leakage current generated by the first memory cells on the first global bit line to obtain the leakage current simulation information further comprises:
comparing the leakage current on the first global bit line with the replica leakage current in the leakage current detection operation to generate a comparison result;

adjusting the setting ratio when the comparison result maintains a first logic level; and repeating the step of comparing and the step of adjusting the setting ratio until the comparison result is changed from the first logic level to a second logic level.

10. The program method of the flash memory device of claim 9, wherein in the leakage current detection operation, the step of detecting the leakage current generated by the first memory cells on the first global bit line to obtain the leakage current simulation information further comprises:

storing the corresponding setting ratio as the leakage current simulation information when the comparison result is changed from the first logic level to the second logic level.

11. The program method of the flash memory device of claim 8, wherein the reference current is formed by adding a comparison current and a compensation current, and in the program operation, the step of providing the reference current according to the leakage current simulation information comprises:

providing the compensation current according to the leakage current simulation information, wherein the compensation current is comparable to the replica leakage current corresponding to the stored setting ratio.

12. The program method of the flash memory device of claim 8, wherein in the leakage current detection operation, all word lines corresponding to the first memory cells are in a disabled state.

13. The program method of the flash memory device of claim 8, wherein in the program operation, a word line corresponding to the selected memory cell is in an enabled state, and word lines corresponding to the remaining first memory cells are in a disabled state.

14. The program method of the flash memory device of claim 8, wherein the memory array further comprises a plurality of second memory blocks, each of the second memory blocks comprises a plurality of second memory cells, and each of the second memory cells is coupled to the corresponding second global bit line, the program method further comprises:

mirroring a test current according to the corresponding leakage current simulation information via a plurality of current mirrors in the program operation to generate a respective compensation current.

* * * * *